Feb. 22, 1966 A. S. MYERS, JR 3,237,022

PULSE DRIVER CIRCUITS

Filed Dec. 8, 1961

2 Sheets-Sheet 1

INVENTOR
AURIE S. MYERS JR.
BY John F. Ostendorf
ATTORNEY

United States Patent Office 3,237,022

Patented Feb. 22, 1966

3,237,022

PULSE DRIVER CIRCUITS

Aurie S. Myers, Jr., Poughkeepsie, N.Y., assignor to International Business Machines Corporation, New York, N.Y., a corporation of New York Filed Dec. 8, 1961, Ser. No. 157,996
10 Claims. (Cl. 307—88.5)

This invention relates to signal generating circuits and, more particularly, to pulse driver circuits employed in addressing a memory array.

Conventional driver circuits ordinarily comprise one or more power amplification stages activated directly by the output pulses of the logic decoding portion of a memory addressing system. Thus, the timing of the selection pulses produced by a driver circuit and the performance of a memory array coupled to the driver circuit are directly dependent on the timing of the pulses provided by the decoding circuitry. As is well known in the art, decoding circuits produce pulses having considerable variation in frequency, duration and rise time. Consequently, the selection pulses are not uniform, and as a result, memory performance cannot be optimized.

Accordingly, it is an object of this invention to provide a driver circuit which alleviates these conditions by producing memory cell selection pulses that are independent of the input pulses supplied by the decoding logic circuitry to the driver circuitry.

It is another object of the invention to provide a memory cell driver circuit which is self-timing.

It is a further object of the invention to provide a signal generator circuit operable as a single-shot or monostable multivibrator.

It is still a further object of the invention to provide a driver circuit which produces selection pulses having fixed duration and constant rise time.

Another object of the invention is to provide a driver circuit for a memory array that includes transistors operable in nonsaturating manner permitting the circuit to operate at high speeds in the nanosecond range.

A further object of the invention is to provide a driver circuit that can be employed for providing selection pulses for a memory array having either tunnel diodes or magnetic cores as the storage elements.

Yet, a further object of the invention is to provide driver circuitry capable of producing either unipolar or bipolar memory cell selection pulses in response to unipolar input pulses.

In accordance with an aspect of the invention, there is provided a high speed driver circuit for producing memory cell selection pulses that are timed independently of an input signal provided by decoding logic circuitry to the driver circuitry. The circuit comprises a current mode switching block having a first transistor conducting and a second transistor nonconducting in the absence of the input signal. The input signal is supplied to the first transistor rendering it nonconducting and the second transistor conducting. In combination with a third transistor, the second transistor forms a latch circuit which is conductive in nonsaturating manner when the second transistor is rendered conducting. Means are responsive to the output of the latching circuit to supply a selection pulse to the memory array, and means, including a negative resistance device and a delay line, are connected in circuit with the latch circuit for controlling the timing of the selection pulse by resetting the latch thereby restoring the current mode block to the normal condition.

A feature of the invention resides in the use of a current mode switching block in combination with a self-timing latch circuit for producing a memory cell selection pulse having predetermined characteristics in response to an input signal.

Another feature of the invention provides for a negative resistance device and a delay line to control the timing of a latch circuit.

A further feature of the invention provides for a memory array driver circuit to produce an output signal characterized by having either a change in voltage or a change in current.

The foregoing and other objects, features and advantages of the invention will be apparent from the following more particular description of the preferred embodiments of the invention, as illustrated in the accompanying drawings wherein.

Figure 1:
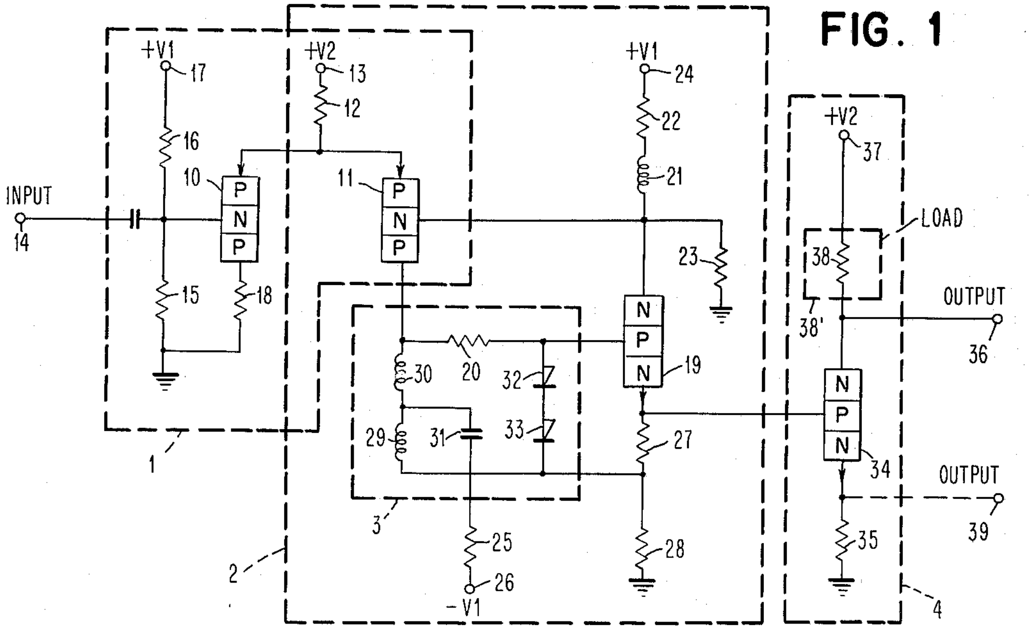
FIG. 1 is a circuit diagram of a driver circuit in accordance with the principles of the invention.

Referring now to FIG. 1, the driver circuit is generally indicated as comprising, in dashed line block form, a current mode switching circuit 1 and a latch 2 including a timing circuit 3 for controlling the operation of the latch and, in turn, the current switching block 1. The circuit also comprises an output driver circuit 4 for producing an output selection pulse to a memory array.

The current switching block comprises the transistors 10 and 11 connected in common at their emitter electrodes through a resistor 12 to a source of bias potential +V2 at a terminal 13. The base electrode of the transistor 10 is connected to receive an input pulse supplied at the input terminal 14 by the logic decoding circuitry (not shown) of a memory addressing system. Biasing of the base electrode is accomplished by a voltage divider including the resistors 15 and 16 connected between a positive voltage supply +V1 connected to a terminal 17 and a reference voltage, preferably ground. Similarly, biasing of the base electrode of transistor 11 is accomplished through the network including an inductance 21 and a voltage divider comprising resistors 22–23 connected between voltage supply +V1 at a terminal 24 and reference potential. The collector electrodes of the transistors 10–11 are biased, respectively, from reference potential through a resistor 18 and from the voltage supply −V1 at a terminal 26 through a resistor 25 and the timing circuit 3.

Resistor 12 and the voltage supply at terminal 13 act as a current source, so that under normal operating conditions (in the absence of an input signal), transistor 10 conducts current from this source to reference potential. Concurrently, transistor 11 is biased to a nonconducting condition. It should be noted that this normal condition of circuit operation is achieved by the manner in which the voltage dividers, including the resistors 15–16 and 22–23 are designed.

When an input pulse of positive polarity is supplied to the circuit at terminal 14, the transistor 10 is rendered nonconducting and current from the source is conducted through the transistor 11. The effect of this change in circuit operation will be more apparent from the description of the circuit which follows:

Transistor 11, in conjunction with a transistor 19, forms a part of the latch circuit 2. The transistors are regeneratively coupled together by means of collector-to-base electrode feedback paths; a resistor 20 being connected in the feedback path from the collector electrode of transistor 11 to the base electrode of transistor 19. Biasing of the collector electrode of transistor 19 is also accomplished through the inductance 21 and the voltage divider, including the resistors 22 and 23.

Timing circuit 3 is also connected across the base-emitter junction of transistor 19 and a resistor 27 of the resistive network 27, 28 for connecting the emitter electrode of transistor 19 to ground. The circuit 3 comprises a pulse forming network, including a pair of series connected inductances 29, 30 and a capacitor 31 in parallel with the inductance 29 for degenerating the latch circuit 2, and at least one bistable device, such as the tunnel diodes 32–33 connected in parallel with the pulse forming network. Effectively, this network approximates a shorted transmission line having the resistance of the diodes 32–33 and the resistor 20 across its open end.

Normally, the latch circuit 2 (transistors 11 and 19) is nonconductive and the tunnel diodes 32–33 are in a low voltage state acting as a clamp on the base voltage of the transistor 19. However, when the transistor 11 is rendered conducting to activate the latch circuit 2, the diodes are switched to a high voltage state changing the biasing on the base electrode of the transistor 19. As transistor 11 conducts, the current from the source 12–13 is divided between the pulse forming network and the resistor 20 to render the transistor 19 conducting; the diodes 32–33, in conjunction with the resistor 27, acting to control the current flow through this transistor to prevent saturated operation of the circuit 2. Since the diodes 32–33 aid in preventing saturated operation of the latch, their characteristics should provide a low impedance level in both stable conditions to reduce the capacity in the circuit thereby increasing its switching speed.

Conduction in the latch circuit 2 continues for a period of time dependent on the time constants of the inductances 29–30 and the capacitor 31 to provide a well-defined voltage level at the emitter electrode of transistor 19. At the end of conduction, the inductance 21 in the collector circuit of the transistor 19 acts as a high impedance together with the resistor 22 to supply base current to the base electrode of transistor 11 during turn-off of transistors 11 and 19.

The timing circuit 3 has been shown and described as employing two bistable devices (for example, the diodes 32–33 connected in series) to increase the voltage at the base electrode of the transistor 19. However, it is readily apparent that one tunnel diode can be employed in the circuit to accomplish the same function; the second diode serving to enhance the operation of the circuit by further increasing the voltage reference level at the base electrode of the transistor 19.

As thus far described, it is readily apparent that the circuit performs as a single shot or monostable multivibrator having a stable condition when the transistor 10 is conducting and the transistors 11 and 19 are nonconducting, and a quasi-stable state when the transistors 11 and 19 are conducting and the transistor 10 is nonconducting. As previously stated, the length of time that this circuit remains in the quasi-stable state is determined by the time constant of the pulse forming network. During this period, the transistor 19 provides well-defined voltage levels at its emitter electrode that are independent of the duration of the input signal and dependent on the parameters of the pulse forming network. At the end of the network time constant, the circuit automatically switches back to its stable state of operation.

The output of the latch circuit 2 is coupled from the emitter electrode of transistor 19 to the base electrode of a transistor 34 connected in common emitter circuit configuration to reference potential through a resistor 35. Transistor 34, which is normally in a nonconducting state, serves as the output or drive transistor of the circuit receiving an input signal equivalent to the sum of the voltage drops produced in the resistors 27 and 28. During the conduction of the latch circuit 2, the current from the transistor 11 added to the current from transistor 19 in resistor 28 produces a more positive voltage level for the transistor 34, than that obtained during the nonconducting portion of the operating cycle of latch circuit 2. This causes transistor 34 to be rendered conducting.

If the circuit is operating as a pulse generator, an output pulse is provided to a load circuit (not shown) at an output terminal 36 coupled to the collector electrode of transistor 34 and across the resistor 38. This resistor is connected to a positive voltage supply +V2 at 37 for biasing the collector electrode of transistor 34. However, if the load circuit is a memory array having cores as the storage elements, it may be connected as indicated in dotted lines at 38′, in place of the resistor 38 and in series with the supply at 37. Thus, a current drive signal would be provided to it. In like manner, if the circuit is utilized to provide selection pulses to a memory array employing tunnel diodes, the transistor 34 may be connected as an emitter follower to provide a voltage step at an output terminal 39; this connection being indicated in dotted lines.

Regardless of the type of output signals provided by the circuit, it is readily apparent that they have a fixed duration, depending on the time constant of the pulse forming network and independent of the duration of the input pulses. In addition, the pulse forming network makes the rise time of the pulses constant and independent of the input signal, since the network generates it own pulses as soon as it is triggered, and, therefore, the circuit can accept pulses having a slow rise time and provide output pulses having a fast rise time.

Figure 2:
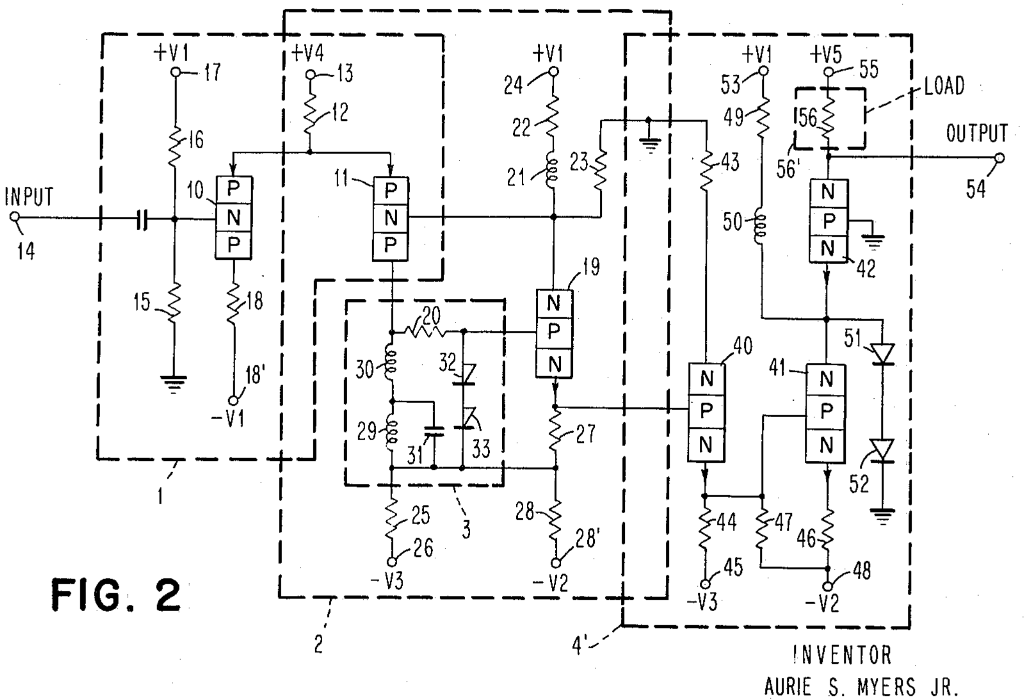
FIG. 2 is a circuit diagram of a modified form of the invention for providing a constant current output; and, FIG. 3 is a circuit diagram of a driver circuit for providing a bipolar output signal.

As shown in FIG. 2, the driver circuit may be modified for providing a constant current output signal to the load circuit (not shown) connected to the output terminal 36. In this circuit, the output driver circuit 4 of FIG. 1 is modified at 4′ to provide the constant current output signal. Therefore, in all other instances, like elements in the two circuits are referred to by like reference characters.

It should be noted, however, that the biasing circuitry at 18′ and 28′ for the transistors 10 and 19 in FIG. 2 has been modified to lower the level of the voltage step provided to the driver circuit 4′. This change does not affect the operation of the current mode switching block 1, and the latching circuit 2, and, therefore, a well-defined voltage step is also provided at the emitter electrode of the transistor 19.

In the driver circuit 4′ of FIG. 2, the transistor 40 is connected as an emitter follower to supply constant voltage steps at its output to a transistor 41 operative as a current switch for a drive transistor 42 connected in grounded base configuration in the collector circuit for transistor 41. The transistor 40, which is referenced to ground potential through a resistor 43 at its collector electrode and biased through a resistor 44 at its emitter electrode by a voltage supply −V3 at a terminal 45, serves to isolate the drive transistor 42 from the latch circuit 2 to prevent any inductive kick occurring in the circuit output from being coupled to the latch circuit.

The grounded base configuration of the transistor 42 permits the circuit to operate at a high repetition frequency. However, this configuration necessitates the use of the transistor 41 at its emitter electrode to enhance the speed of circuit operation. This effect is partially achieved through the reduction of the base-to-collector capacitance of the transistor and partially by operating these transistors in the nonsaturated region.

Biasing of the emitter and base electrodes of the transistor 41 is performed through the resistors 46 and 47, respectively, from the voltage supply −V2 connected to the terminal 48. The voltage level at the emitter electrode of transistor 42 is controlled by a network including a resistor 49, inductance 50 and a pair of conventional diodes 51–52 connected between a voltage supply +V1 at terminal 53 and reference potential; the resistor 49 and inductance 50 providing the bias level for the diodes. As is well known in the art, one such diode may be employed to provide a reference level; however, a more well-defined level is obtainable if two diodes are employed as shown.

If the operation of the driver circuit 4' is considered from the time that the transistor 40 provides a voltage step to the base electrode of the transistor 41, it is apparent that transistor 41 is rendered conductive causing transistor 42 to conduct current from the load circuit (not shown) connected at the output terminal 54 in the collector circuit of transistor 42; the current being supplied by the source including the voltage supply +V5 at terminal 55 and a resistor 56. As already indicated in the description of FIG. 1, when the circuit is operating as a constant current driver for a memory array having cores as the storage elements, the load circuit would replace the resistor 56, as indicated at 56'.

The current is conducted through the transistor 41, resistor 46 to the negative supply −V2; the resistor 46 controlling the output current from the transistor 41. At the end of the voltage step to the base electrode of transistor 41, it reverts to a nonconducting state and the current flow ends. The purpose of the inductance 50 is essentially the same as that of the inductance 21, i.e., when transistor 41 ceases driving transistor 42, the inductance 50 supplies current to turn off the transistor 42.

Figure 3:
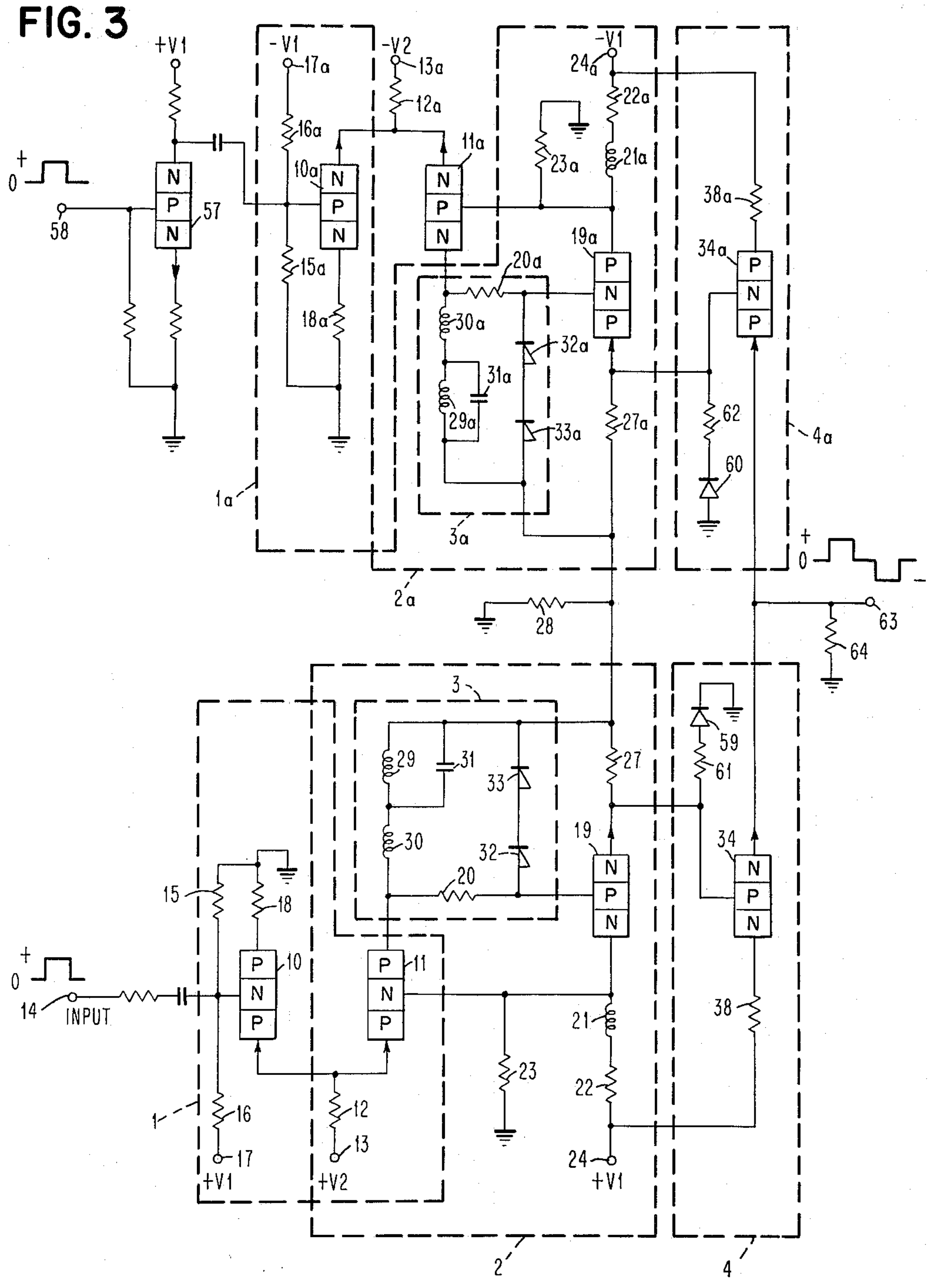

Referring to FIG. 3, the driver circuit of the invention may be modified to provide a bipolar selection pulse output signal in response to the unipolar input signal. If the circuit is considered as comprising upper and lower sections, the lower section is substantially the same as the circuit of FIG. 1, and, therefore, the elements thereof are designated by the same reference characters as employed in FIG. 1. This circuit is essentially duplicated by using complementary type transistors in the upper section, and, therefore, the subscript "*a*" is used with the reference characters of the lower section to indicate the comparable components in the upper section. The upper section of the circuit also includes a transistor 57 suitably biased and connected in common emitter circuit configuration to invert the input pulse when it is supplied to an input terminal 58.

The bipolar driver circuit of FIG. 3 has a common output at a terminal 63 which is referenced to ground potential through a resistor 64. In addition, an interconnection at the emitter circuits of the transistor 19 and **19*a* is provided to prevent undesired operation of the transistors in the output driver circuits 4 and 4*a*. Although this aspect of operation should be readily apparent, it may be illustrated by considering the lower section as being operative to provide a positive output pulse. In the absence of this interconnection, this same output pulse would be applied to the emitter electrode of the transistor 34*a* of the driver circuit 4*a* to bias it in a forward direction, since its base electrode would not be driven positive at the same time. By interconnecting the sections, the positive voltage at the emitter electrode of transistor 19 is developed across the resistor 28 and is supplied to the base electrode of the transistor 34*a* to drive it positive. Diodes 59 and 60 are also connected in series with the loading resistors 61, 62 for the base electrodes of the transistors 34, 34*a***, in order to provide added cancellation signals for the section of the driver circuit which is not being operated.

Operation of the upper section of the circuit is substantially the same as that of the lower section or of the circuit of FIG. 1 In the absence of an input signal, the transistor **10*a* is conducting and the remaining transistors are nonconducting providing a ground level output signal. However, when a positive pulse is applied to transistor 57 from the terminal 58, the complement is supplied to transistor 10*a* due to the capacitive coupling of the transistors. This section then provides a negative output pulse at the terminal 63**.

It should be understood that the unipolar pulse is not supplied to both input terminals simultaneously, but rather according to a particular timed sequence or random selection depending on the memory operation to be performed. Thus, the bipolar driver circuit is particularly useful in providing write and read selection pulses at high speeds to a memory array employing tunnel diodes as the storage elements. In practice, it has been found that the lower and upper sections of the circuit have delays of about ten and fifteen nanoseconds, respectively. In addition to acting as a driver circuit for a tunnel diode memory array, it should be apparent that the circuit may be modified in accordance with FIG. 2 in order to be employed as a constant current driver circuit for a memory array utilizing cores.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A multivibrator operable in response to an input pulse to switch from a stable state to a quasi-stable state to provide a voltage step output signal, comprising a current mode switching block having first and second transistors connected at their emitters to a current source, said first transistor being conducting and said second transistor being nonconducting in the absence of said input pulse, and a latch circuit including, in combination, said second transistor and a third transistor coupled together in regenerative manner said multivibrator operating in said stable state in the absence of said input pulse, said block being responsive to said input pulse to render said first transistor nonconducting and said second transistor conducting, whereby said multivibrator is switched to said quasi-stable state providing said output signal, said latch circuit also comprising means in circuit with said second and third transistors and including an inductive-capacitive network and bistable means for controlling the duration of time that said multivibrator remains in said quasi-stable state before being restored to said stable state.

2. The multivibrator of claim 1, wherein said bistable means comprises at least one device having an unstable negative resistance region bounded by two stable positive resistance regions.

3. In combination, a monostable multivibrator circuit, comprising an input circuit normally conductive in the absence of an input signal, and a latch circuit, coupled to said input circuit and including timing means having bistable means and a delay line, said input circuit being rendered nonconductive in response to said input signal causing said latch circuit to provide an output voltage step, the duration of said step being determined by said timing means; and circuit means responsive to said output voltage step to provide a constant current signal timed independently of the input signal, said circuit means including a current switching device for receiving said voltage step, and a drive device coupled to the output of the current switching device to produce a constant current signal.

4. In combination means including first and second transistors connected as a current mode switching block so that the first transistor is ON and the second transistor is OFF in the absence of an input signal, said first transistor being responsive to said input signal to be switched OFF; and a self-resetting latch circuit comprising said second transistor in combination with a third transistor regeneratively coupled to said second transistor, said second transistor being simultaneously switched ON with said first transistor enabling said latch circuit to provide an output voltage step independent of the duration of the input pulse, and timing means, including a short circuited transmission line having a bistable device across its open end and in circuit with said second and third transistors for controlling the duration of said output voltage step and for preventing saturable operation of said second and third transistors respectively.

5. The latch circuit of claim 4, wherein said transmission line comprises a pair of series connected inductances and a capacitor connected across one of said inductances, and said bistable device comprises a tunnel diode connected across the transmission line, said line and diode being connected in the latch circuit for controlling the level of conductivity of said second and third transistors after the application of said input pulse.

6. A driver circuit, comprising a current switching circuit including first and second transistors connected at their emitters to a current source and normally biased so that said first transistor is conducting and said second transistor is nonconducting, the states of conductivity of said transistors being reversed in response to an input signal, latching means including, in combination, said second transistor and a third transistor regeneratively coupled together for providing a voltage step in response to the change of states of said first and second transistors, timing means in circuit with said second and third transistors for controlling the duration of said voltage step, and means responsive to said voltage step to provide a driver signal independent of the input signal.

7. The circuit of claim 6, wherein said timing circuit comprises a short circuited delay line having at least one negative resistance device connected across its open end for controlling the biasing of said second and third transistors, said delay line acting to establish the duration of said driver signal.

8. The circuit of claim 6, wherein said means for providing said driver signal includes a current switching device and a drive transistor connected in grounded base circuit configuration with the emitter electrode of said transistor being connected to said current switching device so that said current switching device is responsive to said voltage step to drive said transistor.

9. The circuit of claim 8, and further comprising means for isolating said latching means from said driver circuit for preventing inductive feedback to the latching means.

10. A bipolar driver circuit, comprising first and second circuit sections for providing positive and negative driver signals respectively at a common output terminal in response to a unipolar input signal delivered independently to said sections, each of said sections comprising a current switching circuit including first and second transistors normally biased so that the first transistor is conducting and the second transistor is nonconducting in the absence of said input signal, the states of conductivity of said transistors being reversed in response to said input signal, latching means including in combination said second transistor and a third transistor regeneratively coupled together for providing a voltage step in response to a change of state of said first and second transistors and timing means including a delay line and bistable means in circuit with said second and third transistors for controlling the duration of said voltage step, and means responsive to said voltage step to provide said driver signal poled in accordance with the circuit section supplied with said input signal.

References Cited by the Examiner

UNITED STATES PATENTS

| | | | |
|---|---|---|---|
| 3,050,639 | 4/1962 | Tate | 307—88.5 |
| 3,171,978 | 3/1965 | Weber | 307—88.5 |

ARTHUR GAUSS, *Primary Examiner.*